(12) United States Patent
Yanagida et al.

(10) Patent No.: US 9,215,803 B2
(45) Date of Patent: *Dec. 15, 2015

(54) EPOXY RESIN COMPOSITION AND PRE-PREG, SUPPORT-PROVIDED RESIN FILM, METALLIC FOIL CLAD LAMINATE PLATE AND MULTILAYER PRINTED CIRCUIT BOARD UTILIZING SAID COMPOSITION

(75) Inventors: Makoto Yanagida, Ibaraki (JP); Shuuji Gouzu, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 137 days.

This patent is subject to a terminal disclaimer.

(21) Appl. No.: 13/700,561

(22) PCT Filed: May 31, 2011

(86) PCT No.: PCT/JP2011/062516
§ 371 (c)(1), (2), (4) Date: Jan. 10, 2013

(87) PCT Pub. No.: WO2011/152412
PCT Pub. Date: Dec. 8, 2011

(65) Prior Publication Data
US 2013/0108843 A1 May 2, 2013

(30) Foreign Application Priority Data

May 31, 2010 (JP) ................................. 2010-124325
May 31, 2010 (JP) ................................. 2010-124326
May 31, 2010 (JP) ................................. 2010-124327
May 31, 2010 (JP) ................................. 2010-124328

(51) Int. Cl.
| | | |
|---|---|---|
| H05K 1/03 | (2006.01) |
| C08G 59/30 | (2006.01) |
| B32B 15/08 | (2006.01) |
| B32B 27/38 | (2006.01) |
| C08G 59/08 | (2006.01) |
| C08G 59/40 | (2006.01) |
| C08J 5/24 | (2006.01) |
| B32B 3/10 | (2006.01) |
| B32B 15/092 | (2006.01) |
| C08L 63/00 | (2006.01) |
| H05K 3/02 | (2006.01) |
| C08K 5/5313 | (2006.01) |

(52) U.S. Cl.
CPC ................ *H05K 1/0326* (2013.01); *B32B 3/10* (2013.01); *B32B 15/08* (2013.01); *B32B 15/092* (2013.01); *B32B 27/38* (2013.01); *C08G 59/08* (2013.01); *C08G 59/304* (2013.01); *C08G 59/4071* (2013.01); *C08J 5/24* (2013.01); *C08L 63/00* (2013.01); *H05K 1/0366* (2013.01); *C08J 2363/00* (2013.01); *C08K 5/5313* (2013.01); *H05K 1/0306* (2013.01); *H05K 3/022* (2013.01); *Y10T 428/24802* (2015.01); *Y10T 428/24917* (2015.01); *Y10T 428/249951* (2015.04); *Y10T 428/249952* (2015.04); *Y10T 428/257* (2015.01); *Y10T 428/31522* (2015.04); *Y10T 428/31529* (2015.04)

(58) Field of Classification Search
CPC ....................................................... C08L 63/00
USPC ....................................................... 428/195.1
See application file for complete search history.

(56) References Cited

U.S. PATENT DOCUMENTS

| | | | | |
|---|---|---|---|---|
| 6,524,709 | B1 * | 2/2003 | Sagara et al. .................. | 428/413 |
| 6,992,151 | B2 * | 1/2006 | Wang et al. .................... | 525/480 |
| 8,288,003 | B2 * | 10/2012 | Hayashi et al. ................ | 428/413 |
| 2007/0221890 | A1 * | 9/2007 | Gan .............................. | 252/601 |
| 2008/0255315 | A1 | 10/2008 | Ogura et al. | |
| 2011/0054077 | A1 | 3/2011 | Gan | |

(Continued)

FOREIGN PATENT DOCUMENTS

| | | |
|---|---|---|
| CN | 1960997 | 5/2007 |
| CN | 101027336 | 8/2007 |
| JP | 2001-131393 | 5/2001 |

(Continued)

OTHER PUBLICATIONS

Communication mailed Aug. 22, 2014, in connection with Chinese Patent Application No. 201180026192.8, 7 pages.

(Continued)

*Primary Examiner* — Gerard Higgins
(74) *Attorney, Agent, or Firm* — Fitch, Even, Tabin and Flannery LLP

(57) ABSTRACT

The epoxy resin composition according to the present invention contains (A) a phosphorus-containing curing agent and (B) an epoxy resin, wherein the phosphorus-containing curing agent (A) is a phosphorus compound represented by the following Chemical Formula (1); an organic group represented by R in Chemical Formula (1) has two or more phenolic hydroxyl groups; and the organic group has a molecular weight of 190 or more:

[Ka 1]

(1)

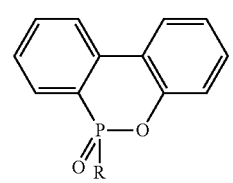

9 Claims, No Drawings

(56) References Cited

U.S. PATENT DOCUMENTS

2013/0108843 A1    5/2013    Yanagida et al.
2013/0126218 A1    5/2013    Gouzu et al.

FOREIGN PATENT DOCUMENTS

| | | |
|---|---|---|
| JP | 2002-265562 | 9/2002 |
| JP | 2011-157434 A | 8/2011 |
| WO | WO 2009/070488 A1 | 6/2009 |
| WO | WO 2010/106698 A1 | 9/2010 |

OTHER PUBLICATIONS

Japanese Office Action issued Jun. 16, 2015, in regards to Japanese Application No. 2011-122800.

Japanese Office Action issued Jun. 16, 2015, in regards to Japanese Application No. 2011-122797.

\* cited by examiner

EPOXY RESIN COMPOSITION AND PRE-PREG, SUPPORT-PROVIDED RESIN FILM, METALLIC FOIL CLAD LAMINATE PLATE AND MULTILAYER PRINTED CIRCUIT BOARD UTILIZING SAID COMPOSITION

TECHNICAL FIELD

The present invention relates to an epoxy resin composition for printed wiring boards, a prepreg, a support-provided resin film, a metal foil clad laminated plate and a multilayer printed wiring board utilizing the epoxy resin composition.

BACKGROUND ART

As information terminal equipments such as personal computers, portable phones and the like are diffused, a reduction in a size and an increase in a density of printed wiring boards mounted in the above equipments are expedited. A mounting form thereof proceeds from a pin insertion type to a surface mount type and proceeds further to an area array type represented by BGA (ball grid array) in which a plastic substrate is used. In circuit boards on which bare chips are directly mounted as is the case with BGA, the chips are connected usually with the circuit boards by wire bonding carried out by thermal supersonic pressure bonding. In the thermal supersonic pressure bonding, circuit boards on which bare chips are mounted are exposed to a high temperature of 150° C. or higher. Accordingly, a heat resistance which can endure a temperature condition in the thermal supersonic pressure bonding is required for electrically insulating resins.

Further, a so-called repairing property in which a chip once mounted is detached from a substrate is required in a certain case. When a chip is detached from a substrate, heat of the same extent as in mounting a chip is applied. Also, when a chip is mounted again on a substrate, it is subjected further to heat treatment. The above repeated heating brings about separation between a fibrous base material of a prepreg and a resin in a certain case in conventional insulating resin systems. A durability (thermal shock resistance) against repeated exposure to high temperature is required to a substrate to which a repairing property is required.

A flame retardance of an epoxy resin can be ensured by adding halogen compounds containing halogen elements such as bromine and the like to it, but carbon monoxide, hydrogen cyanide and the like are generated in a certain case. Further, in epoxy resins to which halogen compounds such as bromine and the like are added, bromine can be decomposed in heating to bring about a reduction in a heat resistance and a reliability. Accordingly, molded articles in which a flame retardance can be ensured without adding halogen compounds to epoxy resins have been desired to be developed.

A method for ensuring a flame retardance without adding halogen compounds includes methods in which fillers such as nitrogen, silicon, aluminum hydroxide and the like are blended. Among them, a method in which phosphorus compounds are blended is widely used. For example, triphenyl phosphate (TPP) and tricresyl phosphate (TCP) which are compounds of a phosphoric acid ester base are used (refer to, for example, a patent document 1). However, when the above phosphorus compounds are added to epoxy resins, they are not reacted with the epoxy resins, and therefore the problem that the resulting molded articles are reduced in a heat resistance, a chemical resistance and the like after absorbing moisture has been brought about.

In contrast with this, a method in which an epoxy resin is reacted with a phosphorus compound to synthesize a phosphorus-containing epoxy resin has been proposed (refer to, for example, a patent document 2). However, dicyandiamide (DICY) is used as a curing agent, and therefore the problem that solvents such as dimethylformamide (DMF), dimethylacetamide (DMAc) and the like which burden a high load to the environment can not help being used has been involved therein. Also, it has not necessarily been able to sufficiently meet a low hygroscopicity, a thermal shock resistance and the like which are required recently.

Further, listed as well are, for example, methods in which phosphorus compounds such as 10-(2,5-dihydroxyphenyl)-10H-9-oxa-10-phosphaphenanthrene-10-oxide (trade name: HCA-HQ, manufactured by Sanko Co., Ltd.), 10-(2,5-dihydroxynaphthyl)-10H-9-oxa-10-phosphaphenanthrene-10-oxide (trade name: HCA-NQ, manufactured by Sanko Co., Ltd.) and derivatives thereof are used as curing agents.

However, the above curing agents have a low solubility in solvents and therefore require pre-reaction, and the problem that the handling property is reduced in terms of complicating the production process has been involved therein.

PRIOR ART DOCUMENT

Patent Documents

Patent document 1: Japanese Patent Application Laid-Open No. 131393/2001
Patent document 2: Japanese Patent Application Laid-Open No. 265562/2002

DISCLOSURE OF THE INVENTION

Problems to be Solved by the Invention

The present invention has been made in order to solve the problems described above, and an object thereof is to provide an epoxy resin composition which is excellent in a handling property and has a high reactivity and which is excellent in a flame retardance and provided with a high heat resistance.

Means for Solving the Problems

The present invention relates to the following items.

[1] An epoxy resin composition containing (A) a phosphorus-containing curing agent and (B) an epoxy resin, wherein the phosphorus-containing curing agent (A) is a phosphorus compound represented by the following Chemical Formula (1); an organic group represented by R in Chemical Formula (1) has two or more phenolic hydroxyl groups; and the organic group has a molecular weight of 190 or more:

[Ka 1]

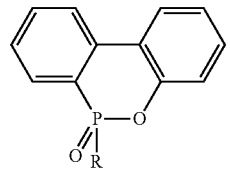

(1)

[2] The epoxy resin composition according to the item [1] described above, wherein the organic group represented by R in Chemical Formula (1) has the following structural unit:

$*_1-(-CH_2-)-*_1$   [Ka 2]

(in the structural unit described above, *1 each is bonded to a carbon atom).

[3] The epoxy resin composition according to the item [1] described above, wherein the organic group represented by R in Chemical Formula (1) has at least one structure selected from structures represented by the following Chemical Formulas (2), (3), (4), (5) and (6) and has two or more phenolic hydroxyl groups:

(* in Formulas (2) to (6) shows a part bonded directly to a phosphorus atom in Chemical Formula (1)):

[Ka 3]

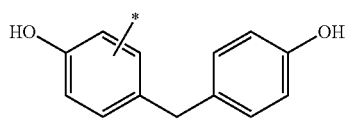
(2)

[Ka 4]

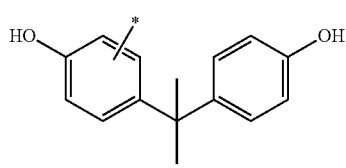
(3)

[Ka 5]

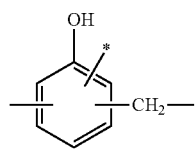
(4)

[Ka 6]

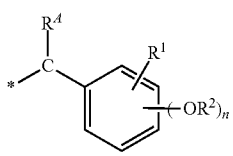
(5)

($R^1$ in Formula (5) is a hydrogen atom or an alkyl group having 1 to 3 carbon atoms, and $R^2$ is an alkyl group having 1 to 4 carbon atoms; n is a number of a $OR^2$ group in the aromatic group and is any of 1 to 3; and $R^A$ is an organic group having two or more phenolic hydroxyl groups);

[Ka 7]

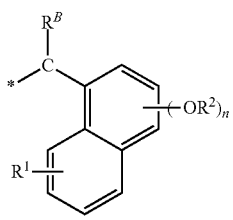
(6)

($R^1$ in Formula (6) is a hydrogen atom or an alkyl group having 1 to 3 carbon atoms, and $R^2$ is an alkyl group having 1 to 4 carbon atoms; n is a number of a $OR^2$ group in the aromatic group and is any of 1 to 3; and $R^B$ is an organic group having two or more phenolic hydroxyl groups).

[4] The epoxy resin composition according to the item [2] or [3] described above, wherein the organic group represented by R in Chemical Formula (1) has at least one structure selected from structures represented by the following Chemical Formulas (7), (8) and (9), and has two or more phenolic hydroxyl groups:

(* in Formulas (7) to (9) shows a part bonded directly to a phosphorus atom in Chemical Formula (1):

[Ka 8]

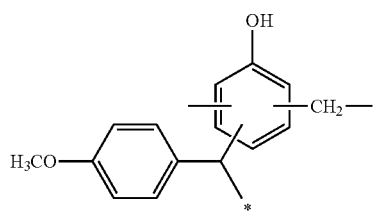
(7)

[Ka 9]

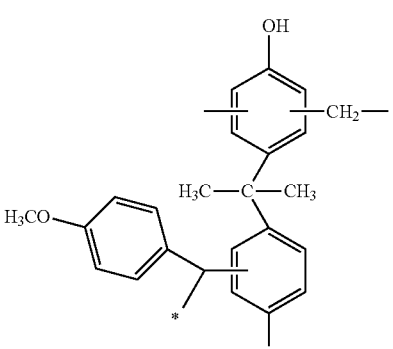
(8)

[Ka 10]

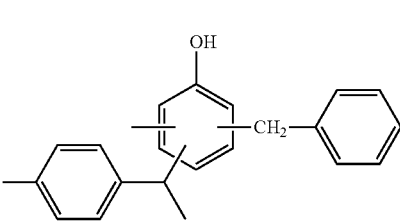
(9)

[5] A prepreg prepared by impregnating a base material with the epoxy resin composition according to any of the items [1] to [4] described above.

[6] A support-provided resin film formed by laminating the epoxy resin composition according to any of the items [1] to [4] described above on a support.

[7] A metal foil clad laminated plate formed by using the prepreg according to the item [5] described above or the support-provided resin film according to the item [6] described above.

[8] A multilayer printed circuit board comprising at least one layer of a layer comprising the prepreg according to the item [5] described above, a layer comprising the support-provided resin film according to the item [6] described above or a layer comprising the metal foil clad laminated plate according to the item [7] described above.

Effects of the Invention

According to the present invention, an epoxy resin composition which is excellent in a handling property and has a high reactivity and which is excellent in a flame retardance and has a high heat resistance, a prepreg, a support-provided resin film, a metal foil clad laminated plate and a multilayer printed wiring board are obtained by using the phosphorus-containing curing agent represented by Chemical Formula (1) described above.

MODE FOR CARRYING OUT THE INVENTION

Epoxy Resin Composition:

The epoxy resin composition according to the present invention contains (A) a phosphorus-containing curing agent represented by the following Chemical Formula (1) and (B) an epoxy resin, wherein the phosphorus-containing curing agent (A) is a phosphorus compound represented by the following Chemical Formula (1); an organic group represented by R in Chemical Formula (1) has two or more phenolic hydroxyl groups; and the organic group has preferably a molecular weight of 190 or more:

[Ka 11]

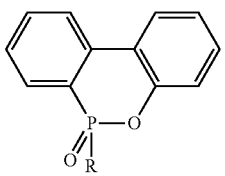

(1)

If the molecular weight is 190 or more, a solubility of the phosphorus-containing curing agent in a solvent is improved, and a handling property thereof is enhanced. Molded articles such as a prepreg, a support-provided resin film, a metal foil clad laminated plate and a multilayer printed wiring board which are obtained from the above epoxy resin composition are excellent in a flame retardance and very good as well in characteristics such as a heat resistance, an electric characteristic, a water resistance and the like.

<Phosphorus-Containing Curing Agent>
Structure of Phosphorus-Containing Curing Agent:

The phosphorus-containing curing agent (A) is a phosphorus compound represented by Chemical Formula (1), and the organic group represented by R in Chemical Formula (1) has preferably the following structural unit:

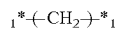   [Ka 12]

(in the structural unit described above, *1 each is bonded to a carbon atom).

Also, in the phosphorus-containing curing agent (A), the organic group represented by R in Chemical Formula (1) has at least one structure selected from structures represented by the following Chemical Formulas (2), (3), (4), (5) and (6) and has two or more phenolic hydroxyl groups. * in Formulas (2) to (6) shows a part bonded directly to a phosphorus atom in Chemical Formula (1):

[Ka 13]

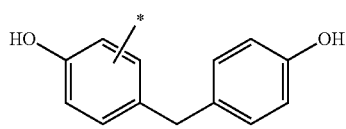

(2)

[Ka 14]

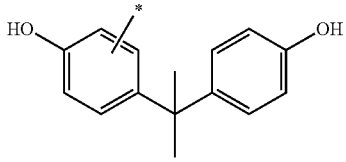

(3)

[Ka 15]

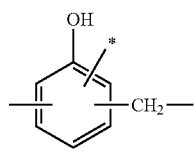

(4)

[Ka 16]

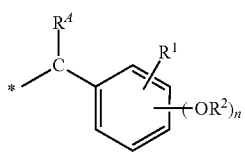

(5)

($R^1$ in Formula (5) is a hydrogen atom or an alkyl group having 1 to 3 carbon atoms, and $R^2$ is an alkyl group having 1 to 4 carbon atoms; n is a number of a $OR^2$ group in the aromatic group and is any of 1 to 3; and $R^A$ is an organic group having two or more phenolic hydroxyl groups);

[Ka 17]

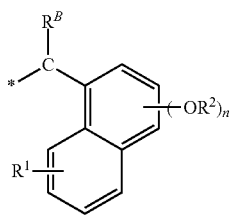

(6)

($R^1$ in Formula (6) is a hydrogen atom or an alkyl group having 1 to 3 carbon atoms, and $R^2$ is an alkyl group having 1 to 4 carbon atoms; n is a number of a $OR^2$ group in the aromatic group and is any of 1 to 3; and $R^B$ is an organic group having two or more phenolic hydroxyl groups).

The organic group represented by R in Chemical Formula (1) can be an organic group having at least one structure selected from structures represented by the following Chemical Formulas (7), (8) and (9) and having two or more phenolic hydroxyl groups. * in Formulas (7) to (9) shows a part bonded directly to a phosphorus atom in Chemical Formula (1):

[Ka 18]

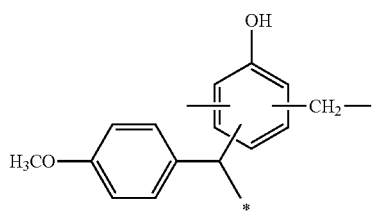
(7)

[Ka 19]

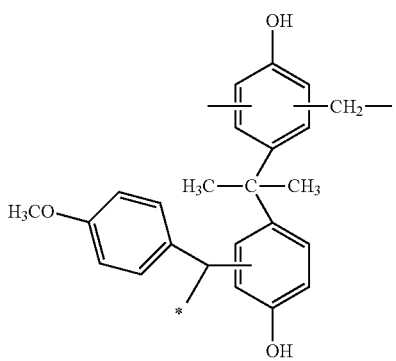
(8)

[Ka 20]

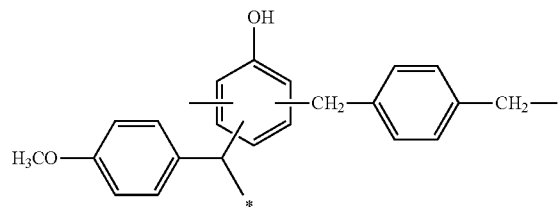
(9)

Molded articles such as a prepreg, a support-provided resin film, a metal foil clad laminated plate and a multilayer printed wiring board which are obtained from the above epoxy resin composition are excellent in a flame retardance and very good as well in characteristics such as a heat resistance, an electric characteristic, a water resistance and the like.

Phosphorus-Containing Curing Agent 1:

The phosphorus-containing curing agent (A) can be a phosphorus compound in which the organic group represented by R in Chemical Formula (1) is provided with the structure represented by Chemical Formula (2) described above. When it is provided with the structure represented by Chemical Formula (2), the epoxy resin composition containing the above phosphorus-containing curing agent is improved in a heat resistance. Further, the phosphorus-containing curing agent is improved in a solubility in a solvent of the reaction system, and therefore it is enhanced in a handling property. In particular, the phosphorus-containing curing agent having the structure represented by Chemical Formula (2) described above has a low viscosity, and therefore it is excellent in a handling property and can be improved in a productivity.

Phosphorus-Containing Curing Agent 2:

The phosphorus-containing curing agent (A) can be a phosphorus compound in which the organic group represented by R in Chemical Formula (1) is provided with the structure represented by Chemical Formula (3) described above. When it is provided with the structure represented by Chemical Formula (3), it is improved in a reactivity with the epoxy resin (B).

Phosphorus-Containing Curing Agent 3:

The phosphorus-containing curing agent (A) can be a phosphorus compound in which the organic group represented by R in Chemical Formula (1) is provided with the structure represented by Chemical Formula (4) described above. When it is provided with the structure represented by Chemical Formula (4), the epoxy resin composition containing the above phosphorus-containing curing agent is improved in a heat resistance.

Phosphorus-Containing Curing Agent 4:

The phosphorus-containing curing agent (A) can be a resin having a structural unit A represented by the following Chemical Formula (10) and a structural unit B represented by the following Chemical Formula (11):

[Ka 21]

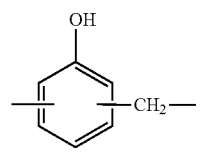
(10)

[Ka 22]

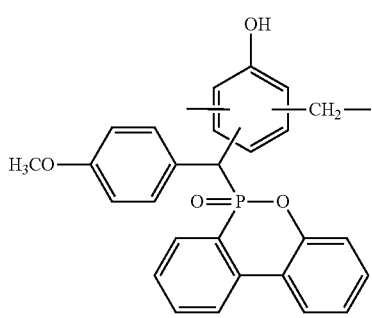
(11)

That is, the above resin may have a unit in which plural structural units A are continuously connected, may have a unit in which plural structural units B are continuously connected, may have a unit in which the structural units A and the structural units B are alternately connected or may have a structure in which the three units described above are mixed.

When a phenol resin having the structural unit described above is used as the phosphorus-containing curing agent, the epoxy resin composition containing the above phosphorus-containing curing agent is excellent in a handling property and provided with a high reactivity. Further, it is excellent in a flame retardance and has a high heat resistance.

Phosphorus-Containing Curing Agent 5:

The phosphorus-containing curing agent (A) can be a resin having a structural unit C represented by the following Chemical Formula (12) and a structural unit D represented by the following Chemical Formula (13):

[Ka 23]

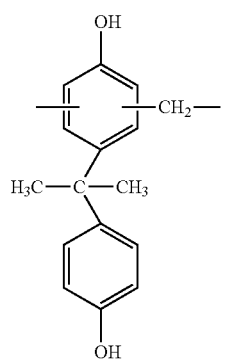
(12)

[Ka 24]

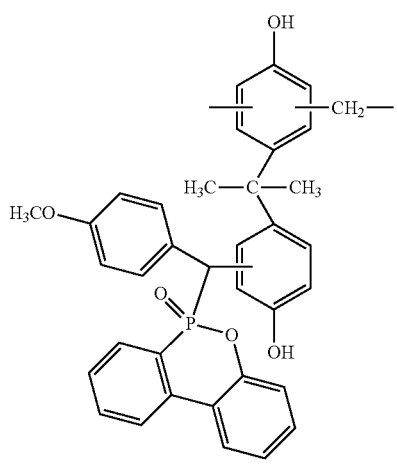
(13)

That is, the above resin may have a unit in which plural structural units C are continuously connected, may have a unit in which plural structural units D are continuously connected, may have a unit in which the structural units C and the structural units D are alternately connected or may have a structure in which the three units described above are mixed.

When a phenol resin having the structural unit described above is used as the phosphorus-containing curing agent, the epoxy resin composition containing the above phosphorus-containing curing agent is excellent in a handling property and provides a high reactivity. Further, it is excellent in a flame retardance and has a high heat resistance.

Phosphorus-Containing Curing Agent 6:

The phosphorus-containing curing agent (A) can be a resin having a structural unit E represented by the following Chemical Formula (14) and a structural unit F represented by the following Chemical Formula (15):

[Ka 25]

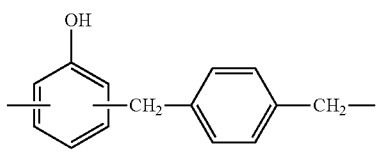
(14)

[Ka 26]

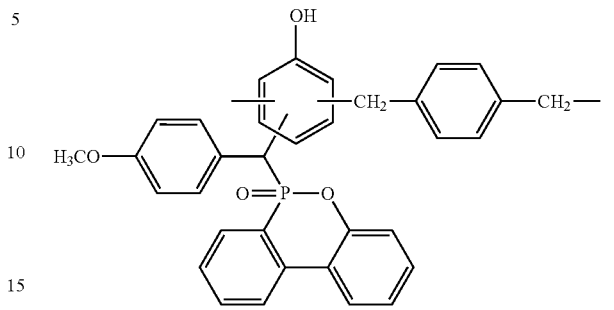
(15)

That is, the above resin may have a unit in which plural structural units E are continuously connected, may have a unit in which plural structural units F are continuously connected, may have a unit in which the structural units E and the structural units F are alternately connected or may have a structure in which the three units described above are mixed.

When a phenol resin having the structural unit described above is used as the phosphorus-containing curing agent, the epoxy resin composition containing the above phosphorus-containing curing agent is excellent in a handling property and provided with a high reactivity. Further, it is excellent in a flame retardance and has a high heat resistance.

Production Process for Phosphorus-Containing Curing Agent:

The phosphorus-containing curing agent (A) represented by Chemical Formula (1) is obtained by reacting a phosphorus compound represented by the following Chemical Formula (16) with a compound having a phenolic hydroxyl group. Also, p-anisaldehyde may be added thereto in a certain case.

[Ka 27]

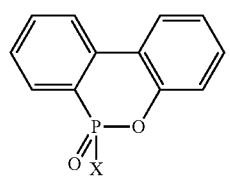
(16)

X in Chemical Formula (16) is a hydrogen atom or a halogen atom.

The compound having a phenolic hydroxyl group which can be used for producing the phosphorus-containing curing agent is preferably compounds having two or more phenolic hydroxyl groups in a molecule, and they include resins (novolac resins) obtained by condensing or co-condensing phenols such as phenol, cresol, xylenol, resorcin, catechol, bisphenol A, bisphenol F and the like or naphthols such as α-naphthol, β-naphthol, dihydroxynaphthalene and the like with aldehydes such as formaldehyde, acetaldehyde, propionaldehyde, benzaldehyde, salicylaldehyde and the like under the presence of an acid catalyst, poly-para-vinylphenol resins and phenol·aralkyl resins having a xylylene group which are synthesized from phenols and dimethylparaxylilene. They may be used alone or in combination of two or more kinds thereof.

<Epoxy Resin>

The epoxy resin (B) used for the epoxy resin composition of the present invention is preferably resins having 1.8 or more epoxy group on average in a molecule. Above all, when the epoxy resins (difunctional epoxy resins) having 1.8 to 2.5 epoxy groups (about 2 epoxy groups) on average in a molecule are used, the resins are provided with a large plasticizing effect. When a bisphenol A type epoxy resin is used as the epoxy resin having 1.8 to 2.5 epoxy groups (about 2 epoxy groups) on average in a molecule, the cured matters having a good adhesive strength and the like are obtained, and when a bisphenol F type epoxy resin is used, the flame retardance is liable to be obtained. Also, when a biphenyl type epoxy resin is used, the cured matters having a low moisture absorption coefficient and high Tg (glass transition temperature) are obtained. Also, the cured matters having high Tg are obtained by using a naphthalene type epoxy resin.

When the epoxy resin (trifunctional epoxy resin) having 2.5 to 3.9 epoxy groups (about 3 epoxy groups) on average in a molecule is used as the epoxy resin (B), the cured matters having further higher Tg are obtained.

Also, when the phenol novolac epoxy resin is used as the epoxy resin (B), the cured matters which have high Tg and are liable to be provided with a flame retardance are obtained.

<Phosphorus Content>

From the viewpoint of a flame retardance, a phosphorus content of the epoxy resin composition is preferably 0.8 to 5.0% by mass, more preferably 1.0 to 2.5% by mass based on a whole solid matter of the resin composition. When the phosphorus content is less than 0.8% by mass based on a whole solid matter of the resin composition, the stable flame retardance is less liable to be obtained, and when it exceeds 5.0% by mass, the characteristics of the cured matters are deteriorated.

In this connection, the phosphorus content is a content of phosphorus atoms in the epoxy resin, and for example, in a case in which one phosphorus atom is present in a substance having a molecular weight of 620 and in which 50% by mass of the above substance is contained in the composition, the phosphorus content is 2.5% by mass (an atomic weight of a phosphorus atom is about 31, and therefore $31/620 \times 0.5 = 0.025$).

<Other Additives>

An inorganic filler and a silane coupling agent may be added as additives to the epoxy resin composition of the present invention. The materials which are excellent in a reduction in a thermal expansion coefficient and an improvement in a flame retardance can be obtained by adding the inorganic filler. Also, addition of the silane coupling agent makes it possible to enhance a dispersibility of the inorganic filler and obtain the materials which are excellent in a chemical resistance and a peeling strength.

In addition thereto, a chemical substance or a resin emitting fluorescence by a UV ray and the like may be added. This emphasizes a copper foil pattern in a silhouette form in inspection after forming circuits of a multilayer printed wiring board produced by using the epoxy resin composition, and this makes it easy to recognize the pattern form and inspect the appearance.

<Production Process for Epoxy Resin Composition>

In obtaining the epoxy resin composition according to the present invention, a solvent may be used, or the epoxy resin composition may be produced under the absence of a solvent. Further, a curing accelerator and other characteristic-providing agents may be added, if necessary, in obtaining the epoxy resin composition.

One example of the production process for the epoxy resin composition using a solvent shall be explained. The phosphorus-containing curing agent (A), the epoxy resin (B), other curing agent components, the phosphorus compound and the like are blended with a solvent such as methyl ethyl ketone and the like, and the mixture is stirred so that the system is homogenized. Then, aluminum hydroxide which is turned into a slurry by the solvent described above is added as a filler, and the mixture is further stirred. A varnish of the epoxy resin composition can be prepared by the above procedure.

Prepreg, Support-Provided Resin Film, Metal Foil Clad Laminated Plate and Multilayer Printed Circuit Board:

A varnish of the epoxy resin composition according to the present invention is coated on a support such as a copper foil, an aluminum foil and the like by means of a comma coater, a transfer coater, a curtain coater, a die coater and the like, and it is dried by heating continuously or discontinuously and turned into a B stage (semi-cured) to form an insulating layer, whereby a supported resin film is obtained. A metal foil thickness of the support-provided resin film described above and an insulating layer resin thickness thereof are optional. Usually, the metal foil thickness is 8 to 80 μm, and the insulating layer resin thickness is 20 to 200 μm.

Further, a varnish of the epoxy resin composition according to the present invention is coated on a glass cloth and a glass nonwoven fabric and impregnated thereinto, and it is dried by heating continuously or discontinuously and turned into a B stage (semi-cured) to obtain a prepreg. A metal foil (for example, a copper foil) is provided and laminated on one face or both faces of the above prepreg, and it is heated and molded, whereby a metal foil clad laminated plate is obtained.

A resin face of the support-provided resin film described above is oppositely laminated via the prepreg on both faces or one face of the metal foil clad laminated plate or a substrate for an inner layer on which a circuit pattern is formed, and the laminated matter is heated and molded. Further, a circuit is formed on an outer layer thereof, whereby a multilayer printed circuit board is obtained.

EXAMPLES

The present invention shall specifically be explained below with reference to examples, but the present invention shall not be restricted to these examples.

Evaluation Methods:

[Evalution Method]

<Flame Retardance>

A test piece of a double face copper clad laminated plate was prepared, and a copper foil of the double face copper clad laminated plate was removed by etching to evaluate a flame retardance thereof according to a vertical flame test (V method) based on a UL-94 standard. When an evaluation thereof was V-0, the flame retardance was rated as good, and when an evaluation thereof was V-1, the flame retardance was rated as inferior.

<Solder Heat Resistance>

A test piece of 50 mm square was prepared from a double face copper clad laminated plate, and the above test piece was floated in a solder heat resistance test equipment heated at 288° C. to measure time spent until abnormality such as blister and the like was confirmed. In the evaluation thereof, "Y minutes OK" shows that abnormality such as blister and the like was not observed until Y minutes elapsed, and "Z minutes NG" shows that abnormality such as blister and the like was generated in Z minutes.

<Glass Transition Point (Tg)>

The glass transition point (Tg) was measured on the condition of a heating rate of 5° C./minute by means of a TMA (thermomechanical analysis apparatus) (TMA-4000, manufactured by Mac Science Co., Ltd.). Heating and cooling were repeated twice, and a temperature in a folding point of a thermal expansion curve in the second heating was defined as Tg.

Production Examples 1 to 5

Production Example 1

Blended were 143 g (resin solid content: 70% by mass (100 g)) of a cresol novolac type epoxy resin (trade name: Epiclon N-673-70M, manufactured by DIC Corporation) as an epoxy resin, 35 g of a cresol novolac type phenol resin (trade name: Phenolite KA-1163, manufactured by DIC Corporation) as a curing agent, 0.2 g of 2-phenylimidazole, 30 g of a phosphorus-containing phenol resin (trade name: XZ-92741, manufactured by The Dow Chemical Company) represented by the following Chemical Formulas (1) and (4) as a phosphorus-containing curing agent, 5 g of 1,3-phenylene-bis-(di-2,6-xylenyl phosphate) (trade name: PX200, manufactured by Daihachi Chemical Industry Co., Ltd.) as a phosphorus compound and 100 g of methyl ethyl ketone (MEK), and the mixture was stirred for about 1 hour until the resins were homogeneously dissolved. Then, 40 g of aluminum hydroxide (trade name: CL-303, manufactured by Sumitomo Chemical Co., Ltd.) as a filler was added thereto in the form of a slurry of methyl ethyl ketone, and the mixture was stirred further for 1 hour. This provided an epoxy resin composition varnish having a phosphorus content set to 1.6% by mass:

[Ka 28]

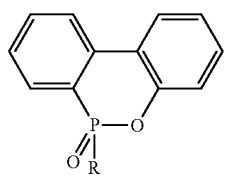

(1)

[Ka 29]

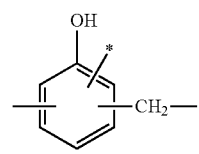

(4)

(* in Formula (4) shows a part bonded directly to a phosphorus atom in Chemical Formula (1)).

Production Example 2

An epoxy resin composition varnish was prepared in the same procedure as in Production Example 1, except that 1,3-phenylene-bis-(di-2,6-xylenyl phosphate) (trade name: PX200, manufactured by Daihachi Chemical Industry Co., Ltd.) was not used and that the filler was not added.

Production Example 3

An epoxy resin composition varnish was prepared in the same procedure as in Production Example 1, except that aluminum hydroxide (trade name: HP-360, manufactured by Showa Denko K.K.) as a filler was added in place of CL303.

Production Example 4

An epoxy resin composition varnish was prepared in the same procedure as in Production Example 1, except that boehmite (trade name: BMT, manufactured by Kawai Lime Industry Co., Ltd.) as a filler was added in place of CL303.

Production Example 5

An epoxy resin composition varnish was prepared in the same procedure as in Production Example 1, except that crushed silica (trade name: F05-30, manufactured by Fukushima Yogyo Co., Ltd.) as a filler was added in place of CL303.

Production Examples 6 to 8

In Production Examples 6 to 8, phosphorus-containing curing agents were synthesized, and the phosphorus-containing curing agents synthesized were used to prepare epoxy resin composition varnishes. A melt viscosity of the phosphorus-containing curing agents at 180° C. and a softening point thereof were measured Gn the following conditions.

Melt viscosity at 180° C.: viscosity measured at a measuring temperature of 180° C. according to ASTM D4287 by means of an ICI/corn plate viscometer.

Softening point: temperature measured by a B & R method according to JIS K7234.

Production Example 6

Synthesis of Phosphorus-Containing Curing Agent

A flask equipped with a thermometer, a cooling tube, a fractioning column, a nitrogen gas introducing tube and a stirrer was charged with 192.4 g (1.85 mole) of a phenol novolac resin, 68.0 g (0.50 mole) of p-anisaldehyde and 108.0 g (0.50 mole) of 9,10-dihydro-9-oxa-10-phosphaphenanthrene-10-oxide (hereinafter abbreviated as HCA), and the mixture was heated up to 180° C. to react them at 180° C. for 8 hours.

Then, water was removed while heating under a reduced pressure to obtain 355 g of a phenol resin (called a phosphorus-containing curing agent X) having a structural unit A represented by the following Chemical Formula (10) and a structural unit B represented by the following Chemical Formula (11). A softening point of the phosphorus-containing curing agent X was measured by the method described above to find that it was 125° C. Also, a melt viscosity thereof at 180° C. was 13 dPa·s. Further, a hydroxyl equivalent thereof was 190 g/eq, and a phosphorus content thereof was 4.2% by mass.

[Ka 30]

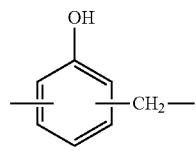

(10)

[Ka 31]

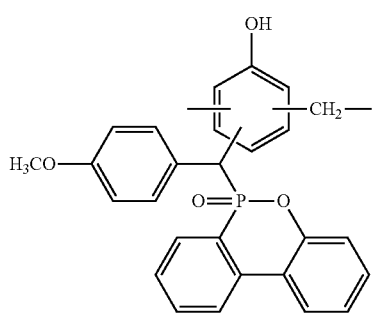

(11)

Preparation of Epoxy Resin Composition Varnish

Subsequently, the phosphorus-containing curing agent X was used as a phosphorus-containing curing agent to prepare an epoxy resin composition varnish.

Blended were 100 g of the cresol novolac type epoxy resin (trade name: N-673-70M, manufactured by DIC Corporation) as an epoxy resin, 20 g of the cresol novolac type phenol resin (trade name: Phenolite KA-1163, manufactured by DIC Corporation) as a curing agent, 0.2 g of 2-phenylimidazole, 60 g of the phosphorus-containing curing agent X as a phosphorus-containing curing agent, 20 g of 1,3-phenylene-bis-(di-2,6-xylenyl phosphate) (trade name: PX200, manufactured by Daihachi Chemical Industry Co., Ltd.) as a phosphorus compound and 80 g of methyl ethyl ketone (MEK), and the mixture was stirred for about 1 hour until the resins were homogeneously dissolved. Then, 30 g of aluminum hydroxide (trade name: CL-303, manufactured by Sumitomo Chemical Co., Ltd.) as a filler was added thereto in the form of a slurry of methyl ethyl ketone, and the mixture was stirred further for 1 hour. This provided an epoxy resin composition varnish having a phosphorus content set to 1.4% by mass.

Production Example 7

Synthesis of Phosphorus-Containing Curing Agent

Reaction was carried out in the same manner as in Production Example 6, except that 330.4 g (2.80 mole) of a bisphenol A novolac resin was used in place of the phenol novolac resin used in Production Example 6. Obtained was 490 g of a phenol resin (called a phosphorus-containing curing agent Y) having a structural unit C represented by the following Chemical Formula (12) and a structural unit D represented by the following Chemical Formula (13). A softening point of the phosphorus-containing curing agent Y was 139° C. (B & R method). Also, a melt viscosity of the phosphorus-containing curing agent Y was 65 dPa·s. Further, a hydroxyl equivalent thereof was 232 g/eq, and a phosphorus content thereof was 3.1% by mass.

[Ka 32]

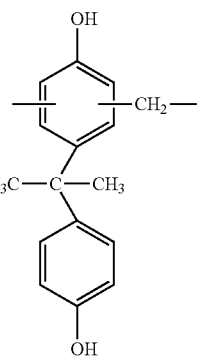

(12)

[Ka 33]

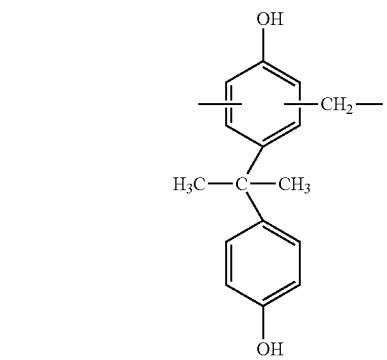

(13)

Preparation of Epoxy Resin Composition Varnish

Subsequently, the phosphorus-containing curing agent Y was used as a phosphorus-containing curing agent to prepare an epoxy resin composition varnish.

Blended were 100 g of the cresol novolac type epoxy resin (trade name: N-673-70M, manufactured by DIC Corporation) as an epoxy resin, 25 g of the cresol novolac type phenol resin (trade name: Phenolite KA-1163, manufactured by DIC Corporation) as a curing agent, 0.2 g of 2-phenylimidazole, 60 g of the phosphorus-containing curing agent Y as a phosphorus-containing curing agent, 20 g of 1,3-phenylene-bis-(di-2,6-xylenyl phosphate) (trade name: PX200, manufactured by Daihachi Chemical Industry Co., Ltd.) as a phosphorus compound and 80 g of methyl ethyl ketone (MEK), and the mixture was stirred for about 1 hour until the resins were homogeneously dissolved. Then, 30 g of aluminum hydroxide (trade name: CL-303, manufactured by Sumitomo Chemical Co., Ltd.) as a filler was added thereto in the form of a slurry of methyl ethyl ketone, and the mixture was stirred further for 1 hour. This provided an epoxy resin composition varnish having a phosphorus content set to 1.3% by mass.

Production Example 8

Synthesis of Phosphorus-Containing Curing Agent

Reaction was carried out in the same manner as in Production Example 6, except that 392.9 g (2.35 mole) of a phenol aralkyl resin was used in place of the phenol novolac resin used in Production Example 6. Obtained was 550 g of a phenol resin (called a phosphorus-containing curing agent Z) having a structural unit E represented by the following Chemical Formula (14) and a structural unit F represented by the following Chemical Formula (15). A softening point of the phosphorus-containing curing agent Z was 102° C. (B & R method). Also, a melt viscosity of the phosphorus-containing curing agent Z was 2.5 dPa·s. Further, a hydroxyl equivalent thereof was 232 g/eq, and a phosphorus content thereof was 2.7% by mass.

[Ka 34]

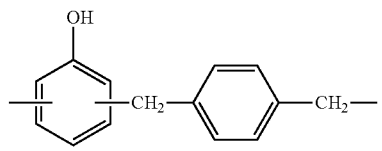

(14)

[Ka 35]

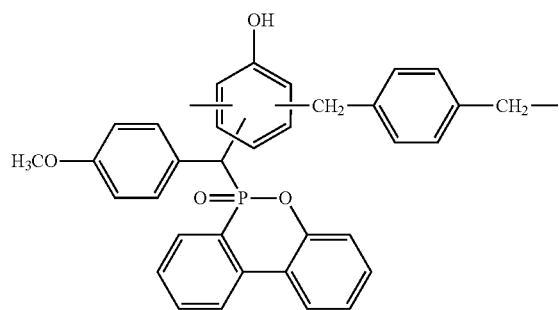

(15)

Preparation of Epoxy Resin Composition Varnish

Subsequently, the phosphorus-containing curing agent Z was used as a phosphorus-containing curing agent to prepare an epoxy resin composition varnish.

Blended were 100 g of the cresol novolac type epoxy resin (trade name: N-673-70M, manufactured by DIC Corporation) as an epoxy resin, 25 g of the cresol novolac type phenol resin (trade name: Phenolite KA-1163, manufactured by DIC Corporation) as a curing agent, 0.2 g of 2-phenylimidazole, 60 g of the phosphorus-containing curing agent Z as a phosphorus-containing curing agent, 20 g of 1,3-phenylene-bis-(di-2,6-xylenyl phosphate) (trade name: PX200, manufactured by Daihachi Chemical Industry Co., Ltd.) as a phosphorus compound and 80 g of methyl ethyl ketone (MEK), and the mixture was stirred for about 1 hour until the resins were homogeneously dissolved. Then, 30 g of aluminum hydroxide (trade name: CL-303, manufactured by Sumitomo Chemical Co., Ltd.) as a filler was added thereto in the form of a slurry of methyl ethyl ketone, and the mixture was stirred further for 1 hour. This provided an epoxy resin composition varnish having a phosphorus content set to 1.3% by mass.

Comparative Production Examples 1 to 3

Comparative Production Example 1

Blended were 143 g (resin solid content: 70% by mass (100 g)) of the cresol novolac type epoxy resin (trade name: Epiclon N-673-70M, manufactured by DIC Corporation) as an epoxy resin, 35 g of the cresol novolac type phenol resin (trade name: Phenolite KA-1163, manufactured by DIC Corporation) as a curing agent, 0.2 g of 2-phenylimidazole, 40 g of 1,3-phenylene-bis-(di-2,6-xylenyl phosphate) (trade name: PX200, manufactured by Daihachi Chemical Industry Co., Ltd.) as a phosphorus compound and 100 g of methyl ethyl ketone, and the mixture was stirred for about 1 hour until the resins were homogeneously dissolved. Then, 40 g of aluminum hydroxide (trade name: CL-303, manufactured by Sumitomo Chemical Co., Ltd.) as a filler was added thereto in the form of a slurry of methyl ethyl ketone, and the mixture was stirred further for 1 hour. This provided an epoxy resin composition varnish having a phosphorus content set to 1.4% by mass:

Comparative Production Example 2

Blended were 100 g of a phosphorus-containing epoxy resin (trade name: FX-298, manufactured by Tohto Kasei Co., Ltd.) as an epoxy resin, 35 g of the cresol novolac type phenol resin (trade name: Phenolite KA-1163, manufactured by DIC Corporation) as a curing agent, 0.2 g of 2-phenylimidazole, 5 g of 1,3-phenylene-bis-(di-2,6-xylenyl phosphate) (trade name: PX200, manufactured by Daihachi Chemical Industry Co., Ltd.) as a phosphorus compound and 100 g of methyl ethyl ketone, and the mixture was stirred for about 1 hour until the resins were homogeneously dissolved. Then, 40 g of aluminum hydroxide (trade name: CL-303, manufactured by Sumitomo Chemical Co., Ltd.) as a filler was added thereto in the form of a slurry of methyl ethyl ketone, and the mixture was stirred further for 1 hour. This provided an epoxy resin composition varnish having a phosphorus content set to 1.5% by mass:

Comparative Production Example 3

Blended were 100 g of the phosphorus-containing epoxy resin (trade name: FX-298, manufactured by Tohto Kasei Co., Ltd.) as an epoxy resin, 20 g of the cresol novolac type phenol resin (trade name: Phenolite KA-1163, manufactured by DIC Corporation) as a curing agent, 5 g of dicyandiamide (DICY), 0.2 g of 2-phenylimidazole, 5 g of 1,3-phenylene-bis-(di-2, 6-xylenyl phosphate) (trade name: PX200, manufactured by Daihachi Chemical Industry Co., Ltd.) as a phosphorus compound, 70 g of methyl ethyl ketone and 30 g of dimethylformamide (DMF), and the mixture was stirred for about 1 hour until the resins were homogeneously dissolved. Then, 40 g of aluminum hydroxide (trade name: CL-303, manufactured by Sumitomo Chemical Co., Ltd.) as a filler was added thereto in the form of a slurry of methyl ethyl ketone, and the mixture was stirred further for 1 hour. This provided an epoxy resin composition varnish having a phosphorus content set to 1.5% by mass:

The compositions of the epoxy resin composition varnishes prepared in Production Examples 1 to 5 and Comparative Production Examples 1 to 3 are shown in Table 1. The compositions of the epoxy resin composition varnishes prepared in Production Examples 6 to 8 are shown in Table 2.

TABLE 1

| Items | | | Production Example | | | | | Comparative Production Example | | |
|---|---|---|---|---|---|---|---|---|---|---|
| | | | 1 | 2 | 3 | 4 | 5 | 1 | 2 | 3 |
| Epoxy resin (g) | | N-673 | 100 | 100 | 100 | 100 | 100 | 100 | 0 | 0 |
| | | FX-298 | 0 | 0 | 0 | 0 | 0 | 0 | 100 | 100 |
| Curing agent (g) | Phenol resin | KA-1163 | 35 | 35 | 35 | 35 | 35 | 35 | 35 | 20 |
| | DICY | | 0 | 0 | 0 | 0 | 0 | 0 | 0 | 5 |
| | Phosphorus phenol resin | XZ-92741 | 30 | 15 | 15 | 15 | 15 | 0 | 0 | 0 |
| Phosphorus compound (g) | | PX-200 | 5 | 0 | 5 | 5 | 5 | 40 | 5 | 5 |
| Filler (g) | | CL-303 | 40 | 0 | 0 | 0 | 0 | 40 | 40 | 40 |
| | | HP-360 | 0 | 0 | 40 | 0 | 0 | 0 | 0 | 0 |
| | | BMT | 0 | 0 | 0 | 40 | 0 | 0 | 0 | 0 |
| | | F05-30 | 0 | 0 | 0 | 0 | 40 | 0 | 0 | 0 |
| Solvent (g) | | MEK | 100 | 100 | 100 | 100 | 100 | 100 | 100 | 70 |
| | | DMF | 0 | 0 | 0 | 0 | 0 | 0 | 0 | 30 |

TABLE 2

| Items | | | Production Example | | |
|---|---|---|---|---|---|
| | | | 6 | 7 | 8 |
| Epoxy resin (g) | | N-673 | 100 | 100 | 100 |
| | | FX-298 | 0 | 0 | 0 |
| Curing agent (g) | Phenol resin | KA-1163 | 20 | 25 | 25 |
| | phosphorus-containing curing agent X | | 60 | 0 | 0 |
| | phosphorus-containing curing agent Y | | 0 | 60 | 0 |
| | phosphorus-containing curing agent Z | | 0 | 0 | 60 |
| Phosphorus compound (g) | | PX-200 | 20 | 20 | 20 |
| Filler (g) | | CL-303 | 30 | 30 | 30 |
| | | HP-360 | 0 | 0 | 0 |
| | | BMT | 0 | 0 | 0 |
| | | F05-30 | 0 | 0 | 0 |
| Solvent (g) | | MEK | 80 | 80 | 80 |
| | | DMF | 0 | 0 | 0 |

Preparation of Prepreg and Copper Clad Laminated Plate

Examples 1 to 5

A glass cloth (trade name: 7629, manufactured by Asahi-Schwebel Co., Ltd.) having a thickness of 0.2 mm was impregnated with the epoxy resin composition varnishes prepared in Production Examples 1 to 5, and it was dried by heating at 120° C. for 20 minutes to obtain a prepreg.

Electrolytic copper foils: F2-WS-18 (trade name, manufactured by Furukawa Electric Co., Ltd.) having a thickness of 18 μm were superposed on both sides of the prepreg so that adhered faces thereof were put together with the prepreg, and it was heated at 180° C. for 30 minutes with the press of 4 MPa under vacuum to prepare a double face copper clad laminated plate.

Examples 6 to 8

The epoxy resin composition varnishes prepared in Production Examples 6 to 8 were used to obtain prepregs by the same method as described above. Further, double face copper clad laminated plates were prepared.

Comparative Examples 1 to 3

The epoxy resin composition varnishes prepared in Comparative Examples 1 to 3 were used to obtain prepregs by the same method as described above. Further, double face copper clad laminated plates were prepared.

Results:

The results obtained by the method described above are shown in Table 3.

TABLE 3

| Items | Example | | | | | | | | Comparative Example | | |
|---|---|---|---|---|---|---|---|---|---|---|---|
| | 1 | 2 | 3 | 4 | 5 | 6 | 7 | 8 | 1 | 2 | 3 |
| Flame retardance | V-0 | V-0 | V-0 | V-0 | V-0 | V-0 | V-0 | V-0 | V-0 | V-0 | V-0 |
| Solder heat resistance (minute) | 10 OK | 20 OK | 15 OK | 20 OK | 20 OK | 20 OK | 20 OK | 20 OK | 5 NG | 5 NG | 10 NG |
| Tg (° C.) | 160 | 170 | 160 | 160 | 160 | 150 | 150 | 150 | 135 | 130 | 145 |

It has been found that the laminated plates of Examples 1 to 8 prepared by using the phosphorus-containing curing agents represented by Chemical Formula (1) have a flame retardance and are provided with a high heat resistance and high Tg. Also, the laminated plates of Examples 1 to 8 show a sufficiently high reactivity as compared with that of Comparative Example 3 prepared by using dicyandiamide (DICY) which is a conventional latent curing agent. Further, it has been found that the above laminated plates are excellent in a solder heat resistance and that they have high Tg and are excellent in a heat resistance.

In Examples 1 to 8, the phosphorus-containing curing agents can be dissolved in methyl ethyl ketone (MEK) which is a conventional solvent without using dimethylformamide (DMF) which has a high boiling point and is hygroscopic in order to dissolve dicyandiamide (DICY) which is a conventional curing agent as is the case with the comparative example using dicyandiamide (DICY). On the other hand, the laminated plates of Comparative Examples 1 to 3 in which the phosphorus-containing curing agent represented by Chemical Formula (1) was not used are inferior in a solder heat resistance, and they have low Tg and are inferior in a heat resistance.

What is claimed is:

1. An epoxy resin composition containing (A) a phosphorus-containing curing agent and (B) an epoxy resin, wherein the phosphorus-containing curing agent (A) is a phosphorus compound represented by the following Chemical Formula (1); an organic group represented by R in Chemical Formula (1) has at least one structure selected from structures represented by the following Chemical Formulas (2), (3) and (4) and has two or more phenolic hydroxyl groups; and the organic group has a molecular weight of 190 or more, wherein in Chemical Formulas (2), (3) and (4) * shows a part bonded directly to a phosphorus atom in Chemical Formula (1):

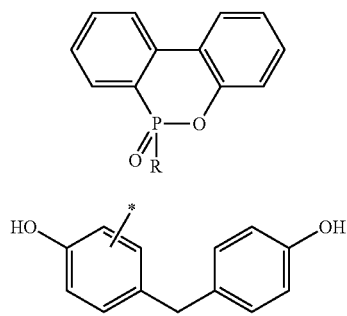

(1)

(2)

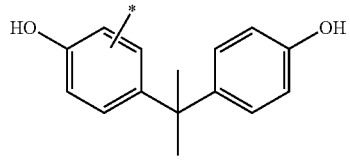

(3)

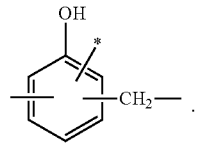

(4)

2. A prepreg comprising a base material impregnated with the epoxy resin composition according to claim 1.

3. A support-provided resin film comprising a laminate of the epoxy resin composition according to claim 1 on a support.

4. A support-provided resin film according claim 3, wherein the support consists of a copper foil or an aluminum foil.

5. A metal foil clad laminated plate comprising metal foil laminate on the prepreg according to claim 2.

6. A metal foil laminated plate comprising a metal foil laminate on the support-provided resin film according to claim 3.

7. A multilayer printed circuit board comprising at least one layer of a layer comprising the prepreg according to claim 2.

8. A multilayer printed circuit board comprising at least one layer of a layer comprising the support-provided resin film according to claim 3.

9. A multilayer printed circuit board comprising at least one layer of a layer comprising the metal foil clad laminated plate according to claim 6.

* * * * *